(12) United States Patent
Yoshida et al.

(10) Patent No.: US 11,049,982 B2
(45) Date of Patent: Jun. 29, 2021

(54) SOLAR CELL ELEMENT

(71) Applicant: KYOCERA CORPORATION, Kyoto (JP)

(72) Inventors: Takanobu Yoshida, Higashiomi (JP); Ryo Matsuoka, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/108,841

(22) Filed: Aug. 22, 2018

(65) Prior Publication Data

US 2018/0366594 A1  Dec. 20, 2018

Related U.S. Application Data

(63) Continuation of application No. PCT/JP2017/007144, filed on Feb. 24, 2017.

(30) Foreign Application Priority Data

Feb. 26, 2016  (JP) .............................. JP2016-035189

(51) Int. Cl.
| | |
|---|---|
| *H01L 31/0216* | (2014.01) |
| *H01L 31/0224* | (2006.01) |
| *H01L 31/0236* | (2006.01) |
| *H01L 31/0288* | (2006.01) |
| *H01L 31/18* | (2006.01) |
| *H01L 31/068* | (2012.01) |

(52) U.S. Cl.
CPC .... *H01L 31/02168* (2013.01); *H01L 31/0288* (2013.01); *H01L 31/02167* (2013.01); *H01L 31/02366* (2013.01); *H01L 31/022441* (2013.01); *H01L 31/068* (2013.01); *H01L 31/1868* (2013.01); *Y02E 10/50* (2013.01)

(58) Field of Classification Search
CPC ............. H01L 31/02168; H01L 31/068; H01L 31/02167; H01L 31/022441; H01L 31/02366; H01L 31/0288; H01L 31/1868; Y02E 10/50; Y02E 10/547
USPC .................................................. 136/243–265
See application file for complete search history.

(56) References Cited

U.S. PATENT DOCUMENTS

| | | | |
|---|---|---|---|
| 2011/0214721 A1 | 9/2011 | Mughal | |
| 2012/0111402 A1 | 5/2012 | Hofmann et al. | |
| 2012/0306058 A1 | 12/2012 | Vermang | |
| 2013/0233381 A1* | 9/2013 | Win ................... | C08G 73/1042 136/256 |

(Continued)

FOREIGN PATENT DOCUMENTS

| | | |
|---|---|---|
| CN | 102246324 A | 11/2011 |
| CN | 103250259 A | 8/2013 |

(Continued)

*Primary Examiner* — Eli S Mekhlin
*Assistant Examiner* — Dujuan A Horton
(74) *Attorney, Agent, or Firm* — Duane Morris LLP (57) ABSTRACT

A solar cell element includes a semiconductor substrate, a passivation layer located on the semiconductor substrate, a protective layer located on the passivation layer, and a first electrode located on the protective layer. The protective layer includes at least one void located from a first lower surface of the first electrode close to the semiconductor substrate up to a first upper surface of the passivation layer close to the first lower surface.

9 Claims, 7 Drawing Sheets

(56) References Cited

U.S. PATENT DOCUMENTS

2016/0172512 A1* 6/2016 Stalcup ............... H01L 31/0516
                                                      136/256
2017/0062633 A1* 3/2017 Carlson ........... H01L 31/022441
2017/0170338 A1* 6/2017 Matsuo ................ H01L 31/068

FOREIGN PATENT DOCUMENTS

| JP | 2005-150609 A | 6/2005 |
| JP | 2012-099822 A | 5/2012 |
| JP | 2012-253356 A | 12/2012 |

* cited by examiner

III-III

SOLAR CELL ELEMENT

CROSS-REFERENCE TO RELATED APPLICATION

The present application is a continuation based on PCT Application No. PCT/JP2017/007144 filed on Feb. 24, 2017, which claims the benefit of Japanese Application No. 2016-035189, filed Feb. 26, 2016. PCT Application No. PCT/JP2017/007144 is entitled "SOLAR CELL ELEMENT", and Japanese Application No. 2016-035189 is entitled "SOLAR CELL ELEMENT". The contents of which are incorporated by reference herein in their entirety.

FIELD

Embodiments of the present disclosure relate to a solar cell element (also referred to as a solar cell).

BACKGROUND

As one structure of solar cell elements, a passivated emitter and rear cell (PERC) structure is known. In a solar cell element having the PERC structure, for example, a passivation layer is located on a silicon substrate.

A protective layer is in some cases located on the passivation layer.

SUMMARY

A solar cell element is disclosed. In one embodiment, a solar cell element includes a semiconductor substrate, a passivation layer located on the semiconductor substrate, a protective layer located on the passivation layer, and a first electrode located on the protective layer. The protective layer includes at least one void located from a first lower surface of the first electrode close to the semiconductor substrate up to a first upper surface of the passivation layer close to the first lower surface.

DETAILED DESCRIPTION

Regarding a solar cell element having the PERC structure, a back-surface electrode is formed by applying a conductive paste on a passivation layer formed on a silicon substrate, and then firing the conductive paste, for example. In this case, for example, with CVD method or the like, a protective layer of silicon nitride, silicon oxynitride, or the like is formed on a passivation layer so as to have a desired pattern, and then the back-surface electrode is formed on the protective layer. With this, for example, the passivation layer can include a region not fired through by the conductive paste during firing.

However, in a solar cell element including a protective layer or in a solar cell module using the solar cell element, for example, the back-surface electrode may expand due to heating and contract due to cooling through a temperature change during formation of the back-surface electrode or under actual usage environment. For this reason, for example, the protective layer in contact with the back-surface electrode may peel off from a top face of the passivation layer.

Therefore, the inventors of the present application created a technology, concerning a solar cell element, capable of making a protective layer less liable to peel off irrespective of a temperature change during formation of an electrode on a back surface side of a substrate or under actual usage environment.

Regarding the above, one embodiment and various modifications will now be described with reference to the drawings. In the drawings, components having similar configuration and function are denoted by the same reference symbols, and overlapping description will be omitted in the description below. The drawings are schematically illustrated, and therefore some of the components are omitted in some cases.

<1. Solar Cell Element>

FIG. 1 to FIG. 5 illustrate a solar cell element 10 according to one embodiment. In examples of FIG. 1 to FIG. 5, the solar cell element 10 according to one embodiment is a PERC solar cell element.

Figure 3:
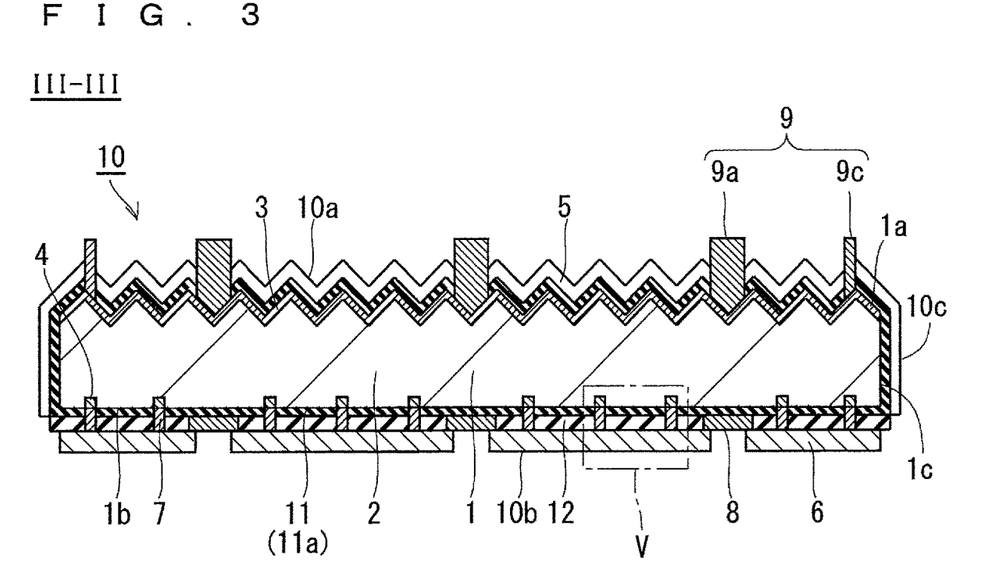
FIG. 3 illustrates an end view showing one example of cross-section of the solar cell element taken along the line of FIG. 1 and FIG. 2.

As illustrated in FIG. 3, the solar cell element 10 includes a front surface 10a, a back surface 10b, and side surfaces 10c. The front surface 10a is a light receiving surface through which mainly light enters. The back surface 10b is a surface located on the opposite side to the front surface 10a. The side surfaces 10c connect the front surface 10a and the back surface 10b.

Figure 4:
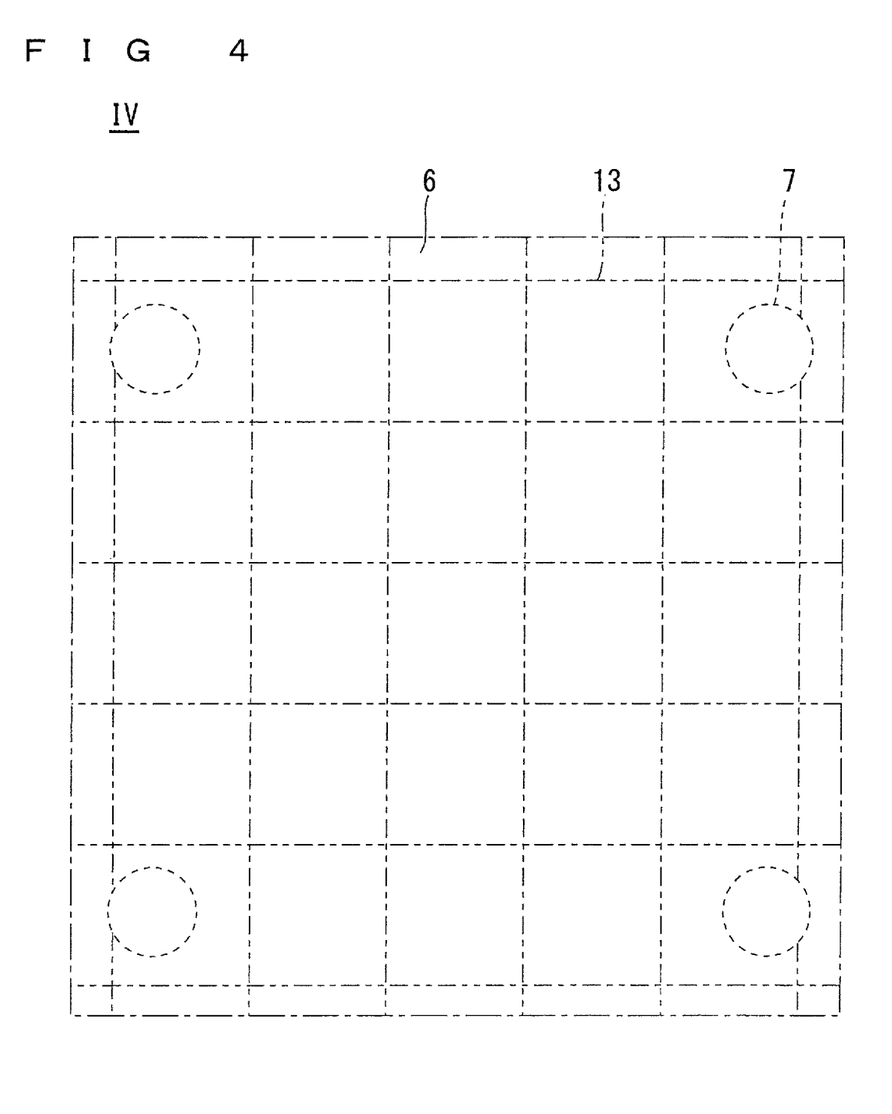
FIG. 4 illustrates an enlarged plan view showing the portion IV of FIG. 2.
Figure 5:
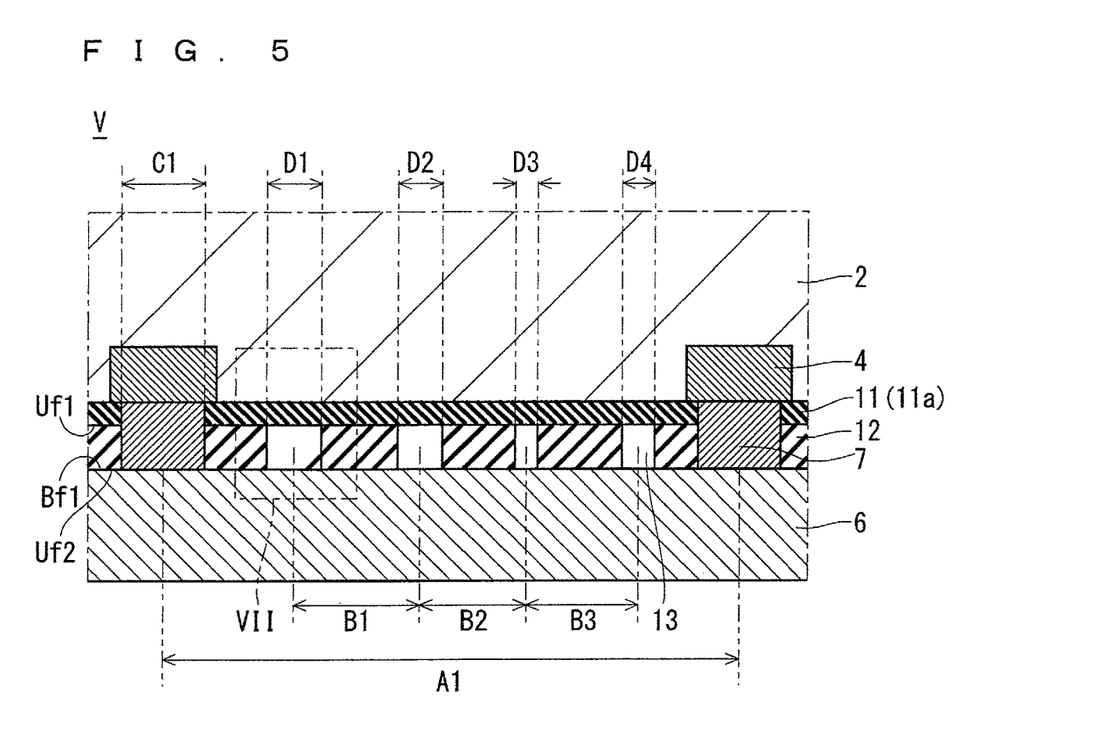
FIG. 5 illustrates an enlarged cross-sectional view showing one example of the portion V of FIG. 3.

The solar cell element 10 includes a silicon substrate 1 as one example of a semiconductor substrate. The solar cell element 10 further includes, for example, as illustrated in FIG. 3 to FIG. 5, an antireflection layer 5, a first electrode 6, second electrodes 7, third electrodes 8, fourth electrodes 9, a passivation layer 11, and a protective layer 12.

The silicon substrate 1 has a first surface 1a, a second surface 1b located on the opposite side to the first surface 1a, and third surfaces 1c. The silicon substrate 1 further includes a first semiconductor layer 2 as a semiconductor region of one conductivity type (e.g., a p-type), and a second semiconductor layer 3 located on the first semiconductor layer 2 on the first surface 1a side as a semiconductor region of an opposite conductivity type (e.g., a n-type). The semiconductor substrate herein may be made of a material other than silicon, as long as the semiconductor substrate includes the first semiconductor layer 2 and the second semiconductor layer 3 as described above.

One example application of a p-type semiconductor as the first semiconductor layer 2 will be described below. In this case, for example, a p-type silicon substrate can be used as the silicon substrate 1. The silicon substrate 1 can be a polycrystalline silicon or monocrystalline silicon substrate, for example. In this case, the silicon substrate 1 can be a substrate having a thickness of 250 µm or less, or a thin substrate having a thickness of 150 µm or less, for example. There is no particular limitation as to the shape of the first surface 1a and the second surface 1b of the silicon substrate 1 herein. Note that, for example, if the silicon substrate 1 has a substantially quadrilateral shape in plan view of the silicon substrate 1, a plurality of solar cell elements 10 can be arrayed. With this, at the time of manufacturing of the solar cell module, gaps between the solar cell elements 10 can be reduced. For example, when a polycrystalline silicon substrate is adopted as the silicon substrate 1, impurities such as boron and gallium are contained as dopant elements in the silicon substrate 1. With this, the first semiconductor layer 2 of the p-type semiconductor can be manufactured.

The second semiconductor layer 3 is, for example, located on the first semiconductor layer 2. Specifically, for example, the second semiconductor layer 3 is located on the first surface 1a side of the first semiconductor layer 2. In this case, the first semiconductor layer 2 and the second semiconductor layer 3 are stacked. The second semiconductor layer 3 has a conductivity type (n-type in one embodiment) that is opposite to the one conductivity type (p-type in one embodiment) of the first semiconductor layer 2. The silicon substrate 1 thereby has a p-n junction portion at an interface between the first semiconductor layer 2 and the second semiconductor layer 3, for example. The second semiconductor layer 3 can be formed by introducing, through diffusion, impurities such as phosphorus as a dopant into a surface layer portion of the silicon substrate 1 on the first surface 1a side, for example.

As illustrated in FIG. 3, for example, the first surface 1a of the silicon substrate 1 may have a fine rough structure (also referred to as a texture) to reduce reflectance of incoming light. For example, the height of each protrusion of the texture ranges approximately from 0.1 µm to 10 µm. The distance between apexes of the adjacent protrusions of the texture ranges approximately from 0.1 µm to 20 µm, for example. Depressions of the texture may each be approximately spherical, and protrusions of the texture may each be pyramidal, for example. The "height of each protrusion" in FIG. 3, for example, refers to a distance between the apex of the protrusion of the texture and a reference line that is defined as a straight line passing through the bottoms of depressions of the texture, in a direction perpendicular to the reference line.

The silicon substrate 1 further includes, for example, a third semiconductor layer 4. The third semiconductor layer 4 is, for example, located on the second surface 1b side of the silicon substrate 1. For example, as a conductivity type of the third semiconductor layer 4, a conductivity type that is the same as that (p-type in one embodiment) of the first semiconductor layer 2 is herein adopted. Note that, for example, concentration of the dopant contained in the third semiconductor layer 4 is higher than concentration of the dopant contained in the first semiconductor layer 2. That is, the third semiconductor layer 4 includes, for example, dopant elements at higher concentration than the concentration of dopant elements doped in the first semiconductor layer 2 so as to have one conductivity type. The third semiconductor layer 4 serves as, for example, a back surface field layer (BSF) that can form an internal electric field on the second surface 1b side of the silicon substrate 1. With this, for example, in the silicon substrate 1, reduction in photoelectric conversion efficiency due to recombination of minority carriers hardly occurs in the vicinity of the surface of the second surface 1b when photoelectric conversion in response to radiation of sunlight is performed. The third semiconductor layer 4 can be formed by introducing, through diffusion, dopant elements such as boron and aluminum into a surface layer portion of the silicon substrate 1 on the second surface 1b side, for example. Specifically, for example, it is sufficient that concentration of the dopant elements contained in the first semiconductor layer 2 be approximately from $5\times10^{15}$ atoms/cm$^3$ to $1\times10^{17}$ atoms/cm$^3$, and that concentration of the dopant elements contained in the third semiconductor layer 4 be approximately from $1\times10^{18}$ atoms/cm$^3$ to $5\times10^{21}$ atoms/cm$^3$. The third semiconductor layer 4 may be, for example, present at a contact portion between the second electrodes 7 to be described later and the silicon substrate 1.

The antireflection layer 5 can, for example, reduce reflectance of light irradiated to the front surface 10a of the solar cell element 10. As a material of the antireflection layer 5, for example, a silicon oxide, aluminum oxide, silicon nitride or the like is adopted. As the refractive index and the thickness of the antireflection layer 5, for example, a refractive index and a thickness that allow light out of sunlight within such a wavelength range that is absorbed into the silicon substrate 1 and can thus contribute to power generation to satisfy low reflection conditions may be appropriately adopted. For example, the antireflection layer 5 may have a refractive index of approximately from 1.8 to 2.5, and a thickness of approximately from 20 nm to 120 nm.

Figure 2:
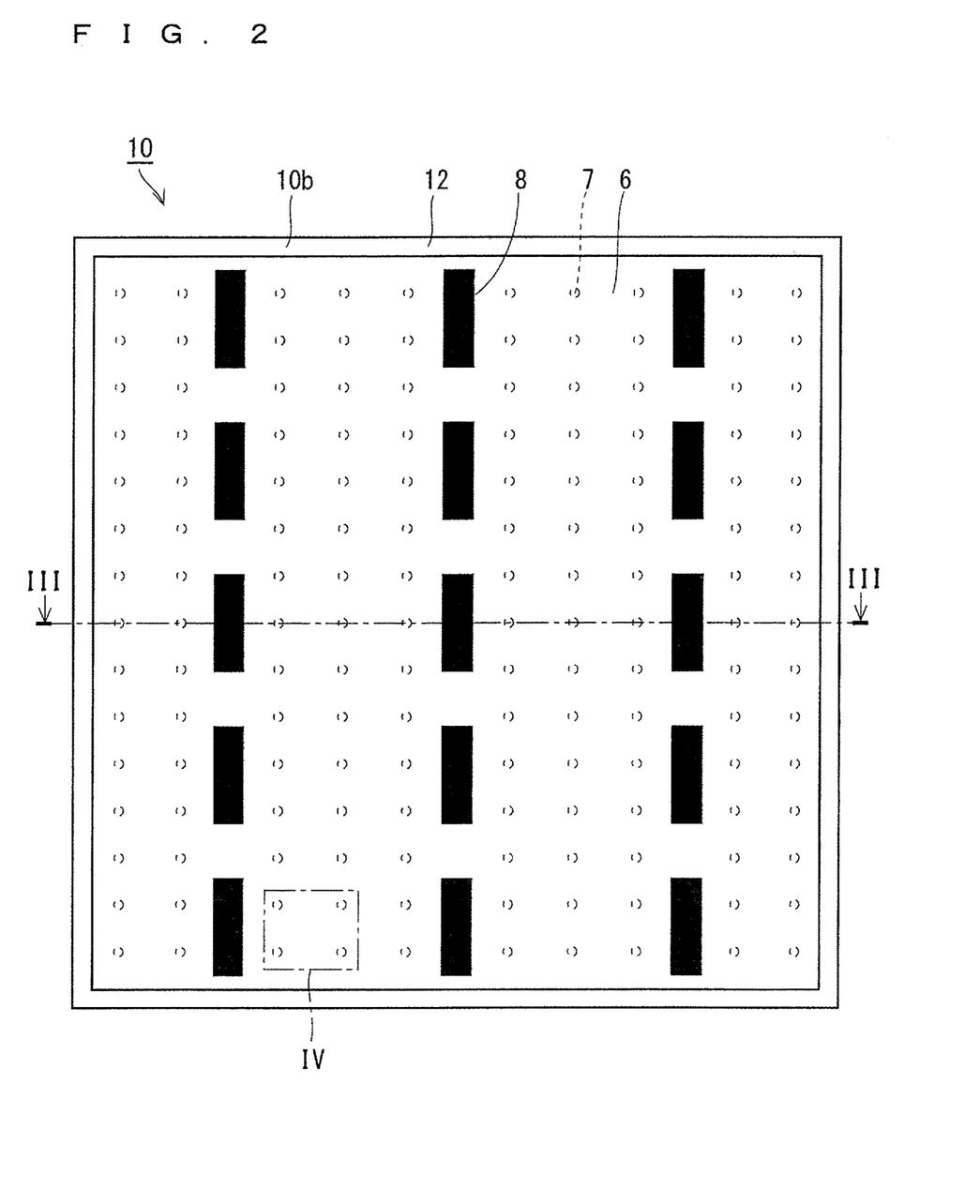
FIG. 2 illustrates a plan view showing one example of external appearance of the solar cell element on a back surface side according to one embodiment.

As illustrated in FIG. 2 and FIG. 3, the first electrode 6 is located on the second surface 1b side of the silicon substrate 1, and serves as an electrode for collecting electricity generated by the silicon substrate 1. The first electrode 6 is, for example, located on the protective layer 12. The first electrode 6 is, for example, located so as to electrically connect the second electrodes 7 and the third electrodes 8. For example, it is sufficient that at least a part of the third electrodes 8 is herein connected to the first electrode 6. The first electrode 6 has a thickness of, for example, approximately from 15 µm to 50 µm. The first electrode 6 contains, for example, aluminum as a main component. In this case, the first electrode 6 can be formed by applying a metal paste containing aluminum as a main component into a desired shape, and then firing the metal paste, for example. In one embodiment, the "main component" refers to a component having 50% or more of a content ratio with respect to the whole component.

For example, as illustrated in FIG. 2 and FIG. 3, the second electrodes 7 are located on the second surface 1b side of the silicon substrate 1 so as to penetrate the passivation layer 11 and the protective layer 12. With this, the second electrodes 7 are, for example, located so as to connect the silicon substrate 1 and the first electrode 6. For example, the second electrodes 7 are connected to the third semiconductor layer 4 located in a portion of the silicon substrate 1 on the second surface 1b side. For example, as illustrated in FIG. 2 and FIG. 3, the second electrodes 7 are located on the second surface 1b side of the silicon substrate 1 at certain intervals. In examples of FIG. 2 and FIG. 3, fifteen rows of second electrodes 7 are present, each row including ten second electrodes 7 separately aligned in line. In other words, a total of 150 (=10×15) second electrodes 7 are present. For example, as illustrated in FIG. 5, the smallest distance between the centers of adjacent second electrodes 7

(hereinafter also referred to as the smallest distance between the centers of the second electrodes) is herein represented by An (note that, the index n is a positive integer; the same applies hereinafter). The smallest length of the second electrode 7 (hereinafter also referred to as the smallest length of the second electrode) refers to, for example, the diameter of the dot (point)-like shape or the short-direction width of the band-like (linear) shape in perspective plan view of the second electrode 7 seen from the back surface 10b side, and is represented by Cn. FIG. 5 illustrates, for example, a smallest distance A1 and a smallest length C1. The second electrode 7 contains, for example, aluminum as a main component. In this case, the second electrode 7 can be formed by applying a metal paste containing aluminum as a main component into a desired shape, and then firing the metal paste, for example. The first electrode 6 and the second electrodes 7, for example, may also be formed at the same time by using the same metal paste containing aluminum as a main component.

For example, as illustrated in FIG. 2 and FIG. 3, the third electrodes 8 are located on the second surface 1b side of the silicon substrate 1. The third electrode 8 serves as, for example, an electrode for extracting electricity obtained by power generation of the solar cell element 10 to the outside. For example, the third electrode 8 has a thickness of approximately from 10 µm to 30 µm. The third electrode 8 has a width of approximately from 1.3 mm to 7 mm. The third electrode 8 contains, for example, silver as a main component. In this case, the third electrode 8 can be formed by applying a metal paste containing silver as a main component into a desired shape with screen printing or the like, and then firing the metal paste, for example.

Figure 1:
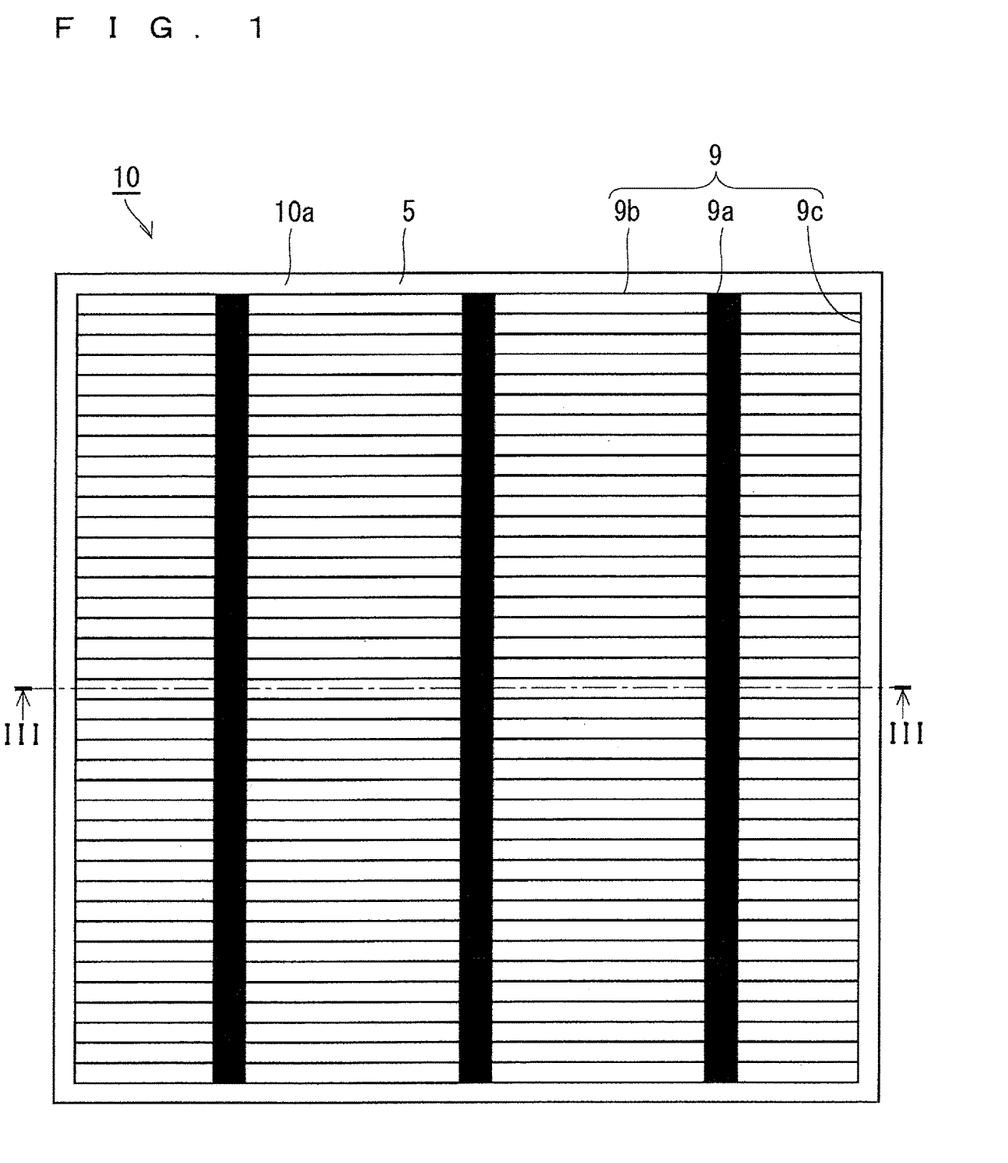
FIG. 1 illustrates a plan view showing one example of external appearance of a solar cell element on a front surface side according to one embodiment.

The fourth electrodes 9 are, for example, electrodes located on the first surface 1a side of the silicon substrate 1. As illustrated in FIG. 1, the fourth electrodes 9 include, for example, an output extracting electrode 9a and a plurality of linear collecting electrodes 9b. The output extracting electrode 9a serves as, for example, an electrode for extracting electricity obtained by power generation to the outside. The output extracting electrode 9a has a short-direction length (hereinafter also referred to as a width) of approximately from 1.3 mm to 2.5 mm, for example. For example, at least a part of the output extracting electrode 9a intersects the collecting electrode 9b. With this, the output extracting electrode 9a is electrically connected to the collecting electrode 9b. The collecting electrode 9b serves as, for example, an electrode for collecting electricity generated by the silicon substrate 1. Each collecting electrode 9b herein has a width of, for example, approximately from 50 µm to 200 µm. In this case, the width of the collecting electrode 9b is smaller than the width of the output extracting electrode 9a. The plurality of linear collecting electrodes 9b are, for example, located at intervals of approximately from 1 mm to 3 mm. The fourth electrode 9 has a thickness of, for example, approximately from 10 µm to 40 µm. The fourth electrode 9 contains, for example, silver as a main component. In this case, the fourth electrode 9 can be formed by applying a metal paste containing silver as a main component into a desired shape with screen printing or the like, and then firing the metal paste, for example. For example, an auxiliary electrode 9c having a shape similar to that of the collecting electrode 9b may be herein located at a peripheral edge portion of the silicon substrate 1 so as to electrically connect the collecting electrodes 9b.

The passivation layer 11 is, for example, located at least on or above the second surface 1b of the silicon substrate 1. The passivation layer 11 can, for example, reduce recombination of minority carriers when photoelectric conversion in response to radiation of sunlight is performed. As the passivation layer 11, for example, an aluminum oxide layer formed by atomic layer deposition (ALD) method is adopted. In this case, for example, aluminum oxide has a negative fixed charge. For this reason, for example, in a region on the second surface 1b side of the silicon substrate 1, minority carriers (electrons in one embodiment) are brought away from an interface between the p-type first semiconductor layer 2 and the passivation layer 11 (a back surface of the silicon substrate 1 herein) due to an electric field effect achieved by the negative fixed charge. With this, for example, recombination of minority carriers is reduced on the second surface 1b side of the silicon substrate 1. As a result, photoelectric conversion efficiency of the solar cell element 10 can be enhanced. The passivation layer 11 has a thickness of, for example, approximately from 10 nm to 200 nm.

The protective layer 12 is, for example, located on the passivation layer 11 so as to have a desired pattern. In this pattern, for example, in perspective plan view of the protective layer 12 seen from the back surface 10b side, a region without the protective layer 12 (also referred to as a non-formation region) is located in a region where the plurality of second electrodes 7 are formed. The non-formation region in perspective plan view may have a shape of, for example, a dot (point)-like shape, or may be a band-like (linear) shape. The non-formation region has a pitch (corresponding to the smallest distance An between the centers of adjacent second electrodes 7) of, for example, approximately from 0.3 mm to 3 mm. It is sufficient that the non-formation region has a diameter or a width (corresponding to the smallest length Cn of the second electrode 7) of, for example, approximately from 10 µm to 500 µm. Adopting such a pitch and a diameter or a width in the non-formation region, for example, satisfactory collecting efficiency of the plurality of second electrodes 7 and a satisfactory electric field passivation effect of the passivation layer 11 are realized in a well-balanced manner. As a result, satisfactory photoelectric conversion efficiency of the solar cell element 10 can be realized.

On the protective layer 12, for example, a metal paste containing aluminum as a main component to form the first electrode 6 and the second electrodes 7 is applied in a desired shape, and then the metal paste is fired. For example, the metal paste applied on the non-formation region of the protective layer 12 fires through the passivation layer 11 during the firing so as to be electrically connected to the silicon substrate 1. In this case, the third semiconductor layer 4 serving as the BSF layer can be formed in the silicon substrate 1. In contrast, for example, the passivation layer 11 is not fired through by the metal paste in a region of the passivation layer 11 that is covered with the protective layer 12. For this reason, the electric field passivation effect attained from the passivation layer 11 is hardly reduced. As described above, the second electrodes 7 are located so as to be connected to the third semiconductor layer 4 present at a surface layer portion of the silicon substrate 1, in a manner penetrating the passivation layer 11 and the protective layer 12. The second electrodes 7 are electrically connected to the first electrode 6. With this, the second electrodes 7 can efficiently extract electricity from the silicon substrate 1.

The protective layer 12 has a thickness of, for example, approximately from 0.5 µm to 10 µm. The thickness of the protective layer 12 is herein appropriately changed in accordance with, for example, the type or the content of a component contained in an insulation paste to be described later, the size of the roughness of the second surface 1b of the silicon substrate 1, the type or the content of a glass fit contained in a metal paste, the firing conditions during formation of the first electrode 6 and the like. The protective layer 12 can be formed by applying an insulation paste to be described later with screen printing or the like, and then drying the insulation paste, for example. For example, as illustrated in FIG. 3, in the protective layer 12, the nonformation region without the protective layer 12 may further be located in a region where the third electrode 8 is formed. In this case, for example, the third electrode 8 comes into direct contact with the silicon substrate 1. With this, joining strength of the third electrode 8 with respect to the silicon substrate 1 can be enhanced. In other words, for example, the third electrode 8 is less liable to peel off.

As the insulation paste, for example, an insulation paste containing a siloxane resin, an organic solvent, and a plurality of fillers is adopted. The siloxane resin is a siloxane compound having a Si—O—Si bond. Specifically, it is sufficient that the siloxane resin be, for example, a low molecular weight resin having a molecular weight of 10,000 or less, which is generated through hydrolysis and condensation polymerization of alkoxysilane, silazane, or the like.

The insulation paste can be generated as follows, for example.

First, a precursor of siloxane resin, water, an organic solvent, and a catalyst are mixed in a container, and is stirred to thereby produce a mixed solution. As the precursor of the siloxane resin, for example, a silane compound including a Si—O bond, a silazane compound including a Si—N bond or the like that has a characteristic of turning into siloxane resin through hydrolysis and condensation polymerization can be adopted. The water serves as a liquid for hydrolyzing the precursor of the siloxane resin. The organic solvent serves as a solvent for producing a paste containing siloxane resin from the precursor of the siloxane resin. The catalyst can control a reaction rate during hydrolysis and condensation polymerization of the precursor of the siloxane resin. As the catalyst, for example, at least one type of inorganic acid or at least one type of organic acid among hydrochloric acid, nitric acid, sulfuric acid, boric acid, phosphoric acid, hydrofluoric acid, acetic acid and the like is used. As the catalyst, for example, at least one type of an inorganic base or at least one type of an organic base among ammonia, sodium hydroxide, potassium hydroxide, barium hydroxide, calcium hydroxide, pyridine and the like may further be used. The catalyst may further be, for example, a combination of inorganic acid and organic acid, or a combination of an inorganic base and an organic base.

Next, for example, a by-product including alcohol, water, etc. generated through hydrolysis and the like during the production of the mixed solution is vaporized by heating in a temperature range of approximately from room temperature to 90° C., for example, to thereby remove the by-product from the mixed solution. If the insulation paste is applied by spraying or the like using a mask, the by-product need not be removed from the mixed solution herein.

Next, for example, a filler including silicon oxide, aluminum oxide, titanium oxide, or the like is added to the mixed solution that has been subjected to the removal of the by-product. In this case, for example, the mixed solution may be stirred. Alternatively, for example, a filler may be mixed at the time when a precursor of siloxane resin, water, an organic solvent, and a catalyst are mixed in a container.

Then, for example, the mixed solution is stored at room temperature, to thereby stabilize viscosity of the mixed solution. With this, the insulation paste is produced. For example, the protective layer 12 may be formed on the passivation layer 11 through a dry process, such as plasma-enhanced chemical vapor deposition (PECVD) method using a mask.

The protective layer 12 contains, for example, silicon oxide as a main component. In this case, for example, a thermal expansion coefficient of the silicon oxide is close to 1, and therefore a tensile or contracting stress due to a temperature change is reduced between the passivation layer 11 and the protective layer 12. With this, for example, a stress to be generated at an interface between the passivation layer 11 and the protective layer 12 can be reduced. As a result, for example, peeling is less liable to occur at the interface between the protective layer 12 and the passivation layer 11. For example, adopting a configuration in which the protective layer 12 includes silicon oxide when the passivation layer 11 includes aluminum oxide, the electric field passivation effect of the passivation layer 11 is herein hardly reduced. For example, aluminum oxide is herein prone to have a negative fixed charge, whereas silicon oxide is prone to have a positive fixed charge. However, for example, density of the positive fixed charge in silicon oxide is prone to be smaller than density of the negative fixed charge in aluminum oxide approximately by one to two digits. Specifically, for example, the density of the negative fixed charge in aluminum oxide is prone to be approximately from $1 \times 10^{11}/cm^2$ to $1 \times 10^{13}/cm^2$, whereas the density of the positive fixed charge in silicon oxide is prone to be approximately $6 \times 10^{10}/cm^2$. With this, for example, the electric field passivation effect of the passivation layer 11 is hardly reduced. Incidentally, for example, density of a positive fixed charge in silicon nitride is approximately $1 \times 10^{12}/cm^2$, which is larger than that of silicon oxide. For this reason, for example, the electric field passivation effect of the passivation layer 11 is hardly reduced in the case where the protective layer 12 includes silicon oxide, as compared to the case where the protective layer 12 includes silicon nitride.

The protective layer 12 may include, for example, an alkyl group in its inside, such as a methyl group ($CH_3$) or an ethyl group ($C_2H_5$). In this case, for example, when the protective layer 12 includes an alkyl group, an electric charge is reduced in a surface of the protective layer 12 containing silicon oxide as a main component. For this reason, the protective layer 12 obtains water repellency, which makes water molecules hardly permeate through protective layer 12. With this, such a solar cell element 10 as to be capable of making peeling between the protective layer 12 and the passivation layer 11 due to permeation of water molecules less liable to occur as well as being excellent in reliability such as moisture resistance can be realized. The presence of an alkyl group in the protective layer 12 can be checked with, for example, time of flight secondary ion mass spectrometry (TOF-SIMS). The protective layer 12 containing an alkyl group can be realized by, for example, forming the protective layer 12 using the above-mentioned insulation paste.

The protective layer 12 may be, for example, located on the side surfaces 10c side of the solar cell element 10 and on the antireflection layer 5 located on an outer peripheral portion of the front surface 10a as well, not only on the passivation layer 11 located on the second surface 1b side of the silicon substrate 1. In this case, for example, leakage current of the solar cell element 10 can be reduced owing to the presence of the protective layer 12.

Incidentally, in one embodiment, the protective layer 12 includes at least one void 13. The void 13 is, for example, as illustrated in FIG. 5, located from a surface (also referred to as a first lower surface) Bf1 of the first electrode 6 on the silicon substrate 1 side up to a surface (also referred to as a first upper surface) Uf1 of the passivation layer 11 on the first lower surface Bf1 side. With this, for example, when a tensile or contracting force is applied to the protective layer 12 from the first electrode 6 due to a temperature change of the solar cell element 10, the protective layer 12 is partially strained and contracted owing to the presence of the void 13. For this reason, for example, the protective layer 12 is less liable to peel off from the top face of the passivation layer 11. For example, even when a load is applied to the solar cell element 10, a bending force to be applied to the protective layer 12 is dispersed owing to the presence of the void 13. For this reason, for example, the protective layer 12 is less liable to peel off from the top face of the passivation layer 11. In one example of FIG. 5, the void 13 is present at a plurality of positions in the protective layer 12. In other words, the protective layer 12 includes a plurality of voids 13. The cross-section of the protective layer 12 including the void 13 can be checked with, for example, a scanning electron microscope (SEM), a transmission electron microscope (TEM) or the like. For example, the solar cell element 10 is herein irradiated with laser light to be divided, a part of the divided solar cell element 10 is embedded as a specimen into epoxy resin, the resin is cured, and then the specimen together with the resin is polished. With this, the cross-section of the protective layer 12 for observation can be prepared. For example, the state of the void 13 in plan view can be checked with a SEM, an optical microscope or the like after removing the first electrode 6 from the solar cell element 10 using hydrochloric acid.

For example, in plan view of the protective layer 12, the void 13 herein may have a linear opening. In other words, for example, the void 13 may have a linear opening on a surface (also referred to as a second upper surface) Uf2 of the protective layer 12 on the first electrode 6 side. In one example of FIG. 4, the void 13 has a linear opening along a thin line indicated by the two-dot chain line. A plurality of voids 13 are located between a plurality of adjacent second electrodes 7. For example, when a tensile or contracting force is applied to the protective layer 12 from the first electrode 6 due to a temperature change of the solar cell element 10, the presence of the linear openings of the voids 13 herein allows the protective layer 12 to be more partially strained and contracted, in comparison with the voids 13 formed into a dot-like shape. With this, for example, the protective layer 12 is further less liable to peel off from the top face of the passivation layer 11.

For example, a distance between the centers of adjacent voids 13 among the plurality of voids 13 in the second upper surface Uf2 of the protective layer 12 on the first electrode 6 side is herein smaller than the smallest distance An between the centers of adjacent second electrodes 7 among the plurality of second electrodes 7. The distance between the centers of adjacent voids 13 is, for example, 200 μm or less. The plurality of voids 13 having such a distance between the centers thereof can be formed during firing of a metal paste for forming the first electrode 6 applied on a dried insulation paste, which is obtained after application and drying of an insulation paste on the passivation layer 11, for example. As a heating temperature during this firing, for example, a temperature approximately from 600° C. to 850° C. may be adopted. For example, when a tensile or contracting force is applied to the protective layer 12 from the first electrode 6 due to a temperature change of the solar cell element 10, the above-mentioned distance between the centers of adjacent voids 13 allows the protective layer 12 to be more partially strained and contracted. For this reason, for example, the protective layer 12 is further less liable to peel off from the top face of the passivation layer 11. Incidentally, the distance between the centers of adjacent voids 13 (hereinafter also referred to as the distance between the centers of the voids) is represented by Bn as illustrated in FIG. 5. It is sufficient that the distance Bn between the centers of adjacent voids correspond to, for example, a distance between the centers of adjacent voids in plan view of the protective layer 12 viewed with a SEM, an optical microscope or the like or in observation of the cross-section of the protective layer 12 viewed with a SEM, a TEM or the like.

For example, an opening width of the void 13 on the second upper surface Uf2 of the protective layer 12 on the first electrode 6 side may be smaller than the smallest length Cn of the second electrode 7. The void 13 has an opening width of, for example, 2 μm or less. In this case, for example, if the diameter of aluminum particles contained in the metal paste for forming the second electrodes 7 is smaller than the smallest length Cn of the second electrode 7 and is larger than the opening width of the void 13, the aluminum particles hardly enter the void 13 during the application of the metal paste on the protective layer 12. With this, for example, a region of the passivation layer 11 fired through the voids 13 by the metal paste is reduced. As a result, for example, the electric field passivation effect is hardly reduced. For example, when the voids 13 have the opening width within the above-mentioned range, excessive reduction in a contact region between the first electrode 6 and the protective layer 12 is alleviated. With this, for example, the first electrode 6 is less liable to peel off from the protective layer 12. As illustrated in FIG. 5, the opening width of each the plurality of voids 13 (hereinafter also referred to as an opening width of the voids) is herein represented by Dn.

Figure 6:
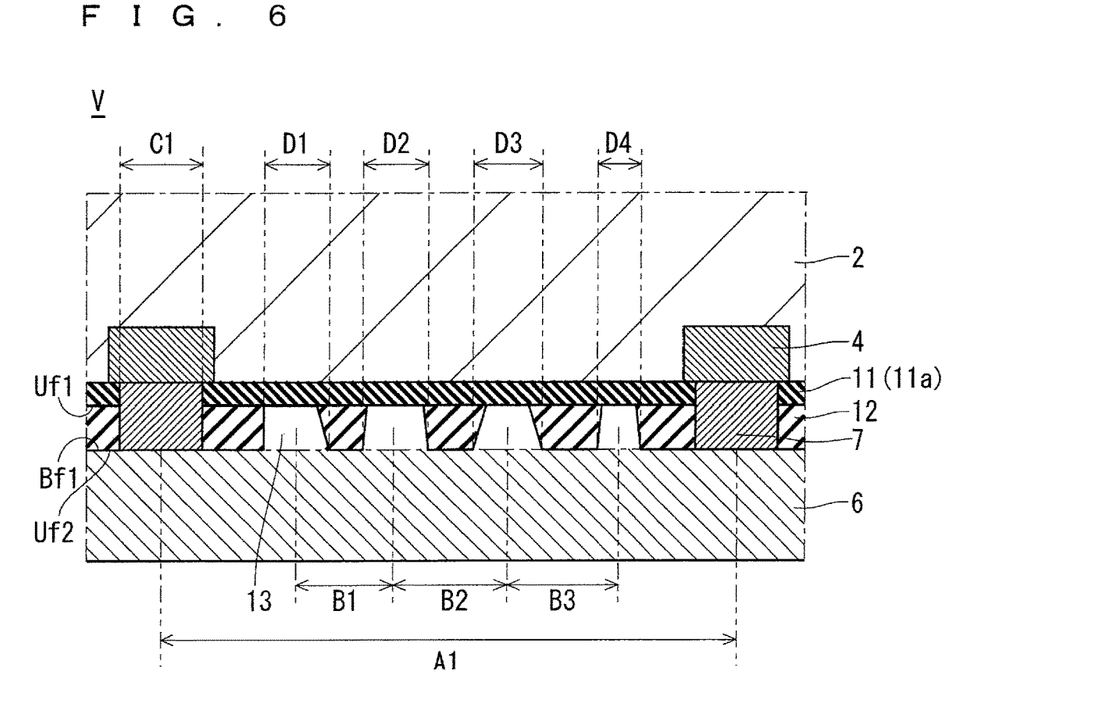
FIG. 6 illustrates an enlarged cross-sectional view showing another example of the portion V of FIG. 3.

For example, as illustrated in FIG. 6, the width of each of the plurality of voids 13 may become smaller as approaching toward the upper surface (first upper surface) Uf1 of the passivation layer 11 from the lower surface (first lower surface) Bf1 of the first electrode 6. It is sufficient that the width of the void 13 be, for example, a short-direction length of the void 13 along the second surface 1b of the silicon substrate 1. Adopting such a structure, for example, a tensile stress and/or a contracting stress to be applied to the protective layer 12 is reduced owing to the small contact area between the first electrode 6 and the protective layer 12. In contrast, for example, the contact area between the protective layer 12 and the passivation layer 11 is larger than the contact area between the first electrode 6 and the protective layer 12. For this reason, for example, a tensile stress and/or a contracting stress applied to the protective layer 12 on the passivation layer 11 side per unit area is reduced. With this, for example, the protective layer 12 is less liable to peel off from the passivation layer 11. For example, as illustrated in FIG. 6, when the width of each of the plurality of voids 13 becomes smaller as approaching toward the first upper surface Uf1 of the passivation layer 11 from the first lower surface Bf1 of the first electrode 6, the distance Bn between the centers of adjacent voids and the opening width Dn of the void are determined based on the voids 13 on the first electrode 6 side.

The present disclosure is not limited to one embodiment described above, and many modifications and changes can be added thereto.

Figure 7A:
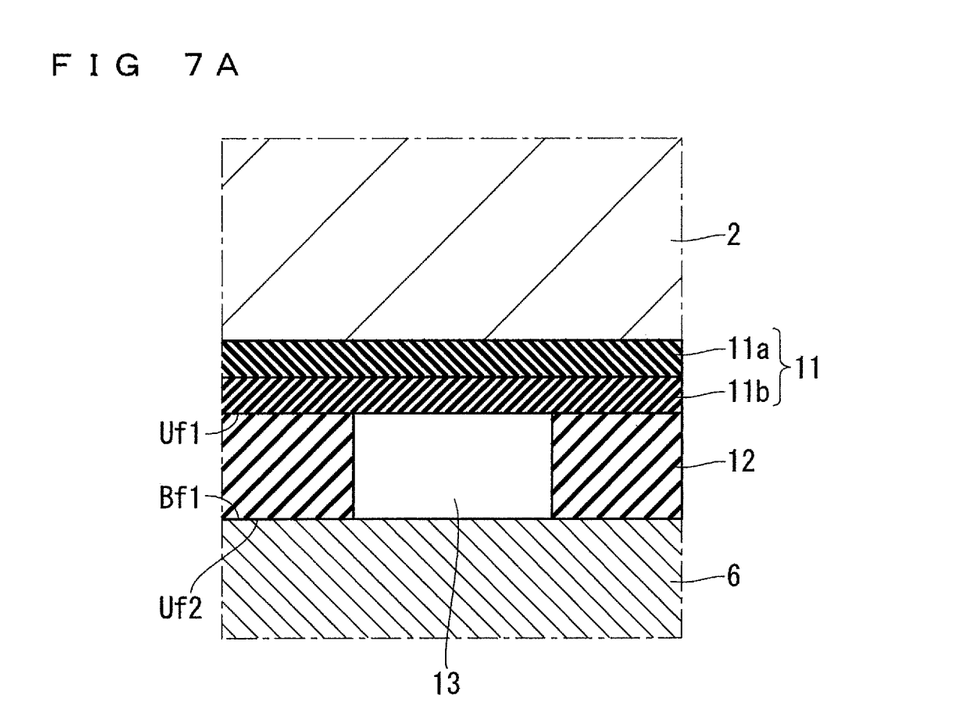
FIG. 7A illustrates an enlarged cross-sectional view showing a portion of a passivation layer corresponding to the portion VII of FIG. 5 according to one modification.

For example, as illustrated in FIG. 7A, the passivation layer 11 may include a second passivation layer (also referred to as a silicon oxide layer) 11b containing silicon oxide, which is located between a first passivation layer 11a containing aluminum oxide and the protective layer 12. The second passivation layer 11b can be formed by ALD method, for example. When the second passivation layer 11b is located between the first passivation layer 11a and the protective layer 12, and the protective layer 12 includes silicon oxide, for example, the second passivation layer 11b serves as a buffer layer between the protective layer 12 and the first passivation layer 11a. For example, when the protective layer 12 contains silicon oxide as a main component, the silicon oxide included in the second passivation layer 11b herein has the same quality as the silicon oxide included in the protective layer 12. For this reason, adhesion between the protective layer 12 and the passivation layer 11 is enhanced. It is sufficient that the second passivation layer 11b have a thickness of, for example, approximately from 5 nm to 15 nm. For example, when the second passivation layer 11b has a thickness within the above-mentioned range, the electric field passivation effect attained from a negative fixed charge of the first passivation layer 11a is hardly reduced even with the influence of a positive fixed charge of the second passivation layer 11b. For example, when the thickness of the second passivation layer 11b is smaller than the thickness of the first passivation layer 11a, the electric field passivation effect attained from the negative fixed charge of the first passivation layer 11a is hardly reduced.

For example, when the second passivation layer 11b is formed by ALD method using a silicon material such as bisdiethylaminosilane (BDEAS), the second passivation layer 11b containing silicon oxide can herein contain carbon and hydrogen. The carbon and hydrogen contained in the second passivation layer 11b can be detected by, for example, measurement using TOF-SIMS. Note that, in this case, unlike the protective layer 12, the second passivation layer 11b hardly contains an alkyl group such as a methyl group ($CH_3$) or an ethyl group ($C_2H_5$), for example. In contrast, the second passivation layer 11b easily contains traces of nitrogen included in a material gas used in ALD method, for example.

Figure 7B:
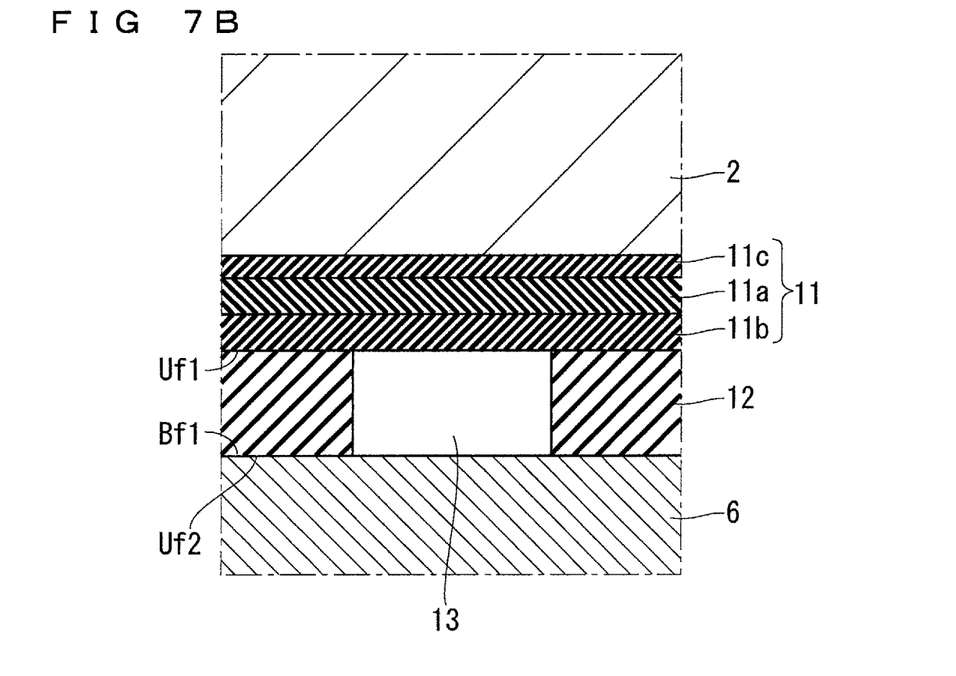
FIG. 7B illustrates an enlarged cross-sectional view showing a portion of the passivation layer corresponding to the portion VII of FIG. 5 according to another modification.

For example, as illustrated in FIG. 7B, the passivation layer 11 may include a third passivation layer (also referred to as a silicon oxide layer) 11c containing silicon oxide, which is located between the first semiconductor layer 2 (a p-type semiconductor region in one embodiment) and the first passivation layer 11a containing aluminum oxide. In this case, for example, the third passivation layer 11c serves as a buffer layer between the silicon substrate 1 and the first passivation layer 11a. With this, for example, adhesion between the silicon substrate 1 and the passivation layer 11 is enhanced. It is sufficient that the third passivation layer 11c herein have a thickness of, for example, approximately from 0.1 nm to 1 nm. When the third passivation layer 11e containing silicon oxide has a thickness within the above-mentioned range, for example, owing to the presence of the third passivation layer 11c, the electric field passivation effect attained from the first passivation layer 11a is hardly reduced even if the third passivation layer 11c has a positive fixed charge. For example, when the thickness of the third passivation layer 11c is smaller than both of the thickness of the first passivation layer 11a and the thickness of the second passivation layer 11b, the electric field passivation effect attained from the first passivation layer 11a is hardly reduced. For example, it is sufficient that the total thickness of the second passivation layer 11b and the third passivation layer 11c be smaller than the thickness of the first passivation layer 11a.

Using ALD method, for example, the second passivation layer 11b and the third passivation layer 11c can be formed without irradiating the silicon substrate 1 or the first passivation layer 11a with plasmas. In this case, for example, plasma damage is hardly caused in the silicon substrate 1 and/or the first passivation layer 11a during the formation of the second passivation layer 11b and the third passivation layer 11c. For example, the plasma damage is herein damage due to etching of the silicon substrate 1 and/or the first passivation layer 11a, which is caused by collision of electrons generated by plasmas. For example, if plasma damage is caused in the silicon substrate 1 and/or the first passivation layer 11a, defects are generated and impurities are herein mixed. As the void 13, for example, a structure that does not include in its inside an electrode component of the first electrode 6 is adopted. It is sufficient that this structure be, for example, a structure in which the center of metal particles of the first electrode 6 is not located in the inside of the void 13 in observation of the cross-section of the protective layer 12 viewed using a SEM or a TEM. Adopting such a configuration, for example, a portion of the passivation layer 11 facing the void 13 is not fired through, and the third semiconductor layer 4 is not formed in and around a surface layer portion of the second surface 1b of the silicon substrate 1 facing the void 13.

The shape of the linear opening of the void 13 may be, for example, a straight line or a curved line such as a wavy line.

For example, the distance Bn between the centers of the voids on the second surface 1b of the protective layer 12 may be equal to or larger than the smallest distance An between the centers of adjacent second electrodes 7. In this case, for example, an insulation paste is required to be printed a plurality of times on the passivation layer 11, with each interval between regions to have a locally large thickness of the insulation paste being equal to or larger than the smallest distance An between the centers of the second electrodes 7.

For example, the shape of the opening of the void 13 on the second upper surface Uf2 of the protective layer 12 is not limited to the linear shape, and may be a dot-like shape. In this case, for example, an insulation paste is printed a plurality of times in a dot-like pattern at portions on the passivation layer 11 to form the voids 13. Thus, the thickness of the insulation paste can be locally increased. With this, for example, cracks are easily generated in the protective layer 12 at portions of the protective layer 12 having a large thickness. The cracks thus generated in this case can serve as the voids 13. For example, it is sufficient that the protective layer 12 be herein formed such that the thickness of the region to form the voids 13 is from 1.3 to 1.5 times or more as large as the thickness of the region not to form the voids 13. Note that, the thickness of the protective layer 12 may be, for example, appropriately changed in accordance with a material of the insulation paste.

For example, the solar cell element 10 need not be a PERC solar cell element. For example, the solar cell element 10 may be a back contact solar cell element having a structure such as interdigitated back contact (IBC), metal wrap through (MWT), and emitter wrap through (EWT). Specifically, for example, it is sufficient that the solar cell element 10 have a structure in which a passivation layer, a protective layer, and an electrode are stacked on the back surface side of the silicon substrate 1.

<2. Method for Manufacturing Solar Cell Element>

Next, each process of a method for manufacturing the solar cell element 10 is described in detail with reference to FIGS. 8A to 8F.

Figure 8A:
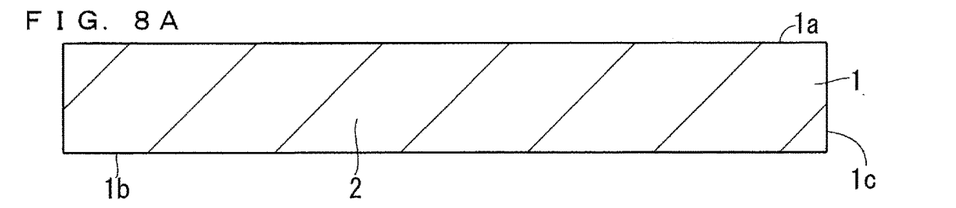
FIG. 8A to FIG. 8F each illustrates an end view for illustrating a method for manufacturing the solar cell element according to one embodiment.

First, as illustrated in FIG. 8A, the silicon substrate 1 is prepared. The silicon substrate 1 is formed by the Czochralski (CZ) method, a casting method, or the like which already exists, for example. One example in which a p-type polycrystalline silicon substrate is used as the silicon substrate 1 will be described below.

First, an ingot of polycrystalline silicon is prepared by casting, for example. Next, the ingot is cut into slices each having a thickness of 250 μm or less, for example, to prepare the silicon substrate 1. Then, for example, in order to remove a mechanically-damaged layer and a contaminated layer of the cut surface of the silicon substrate 1, the surface of the silicon substrate 1 may be slightly etched with an aqueous solution of NaOH, KOH, hydrofluoric acid, hydrofluoric-nitric acid, or the like.

Figure 8B:
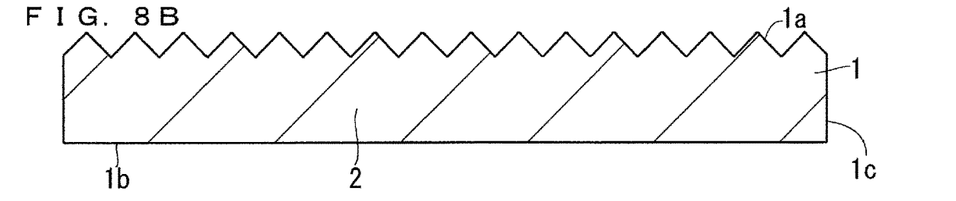

Next, the texture is formed on the first surface 1a of the silicon substrate 1 as illustrated in FIG. 8B. The texture can be formed by wet etching using an alkaline solution including NaOH and the like or an acid solution of hydrofluoric-nitric acid and the like, or by dry etching such as reactive ion etching (RIE), for example.

Figure 8C:
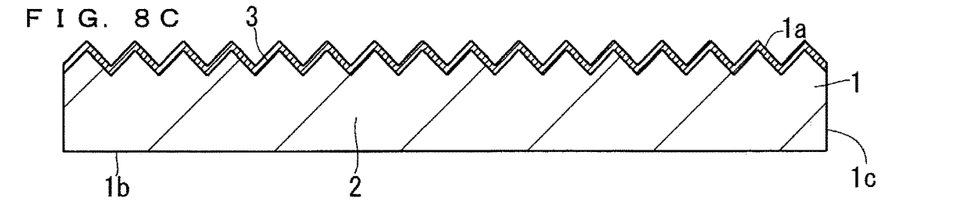

Next, a process of forming the second semiconductor layer 3 as an n-type semiconductor region is performed with respect to the first surface 1a of the silicon substrate 1 having the texture formed in the above-mentioned process, as illustrated in FIG. 8C. Specifically, for example, the second semiconductor layer 3 of the n-type is formed in a surface layer of the silicon substrate 1 on the first surface 1a side having the texture.

Such a second semiconductor layer 3 can be formed by using application thermal diffusion method, gas phase thermal diffusion method, or the like, for example. The application thermal diffusion method may be, for example, a method in which a $P_2O_5$ (diphosphorus pentaoxide) paste is applied on a surface of the silicon substrate 1, and phosphorus is thermally diffused in a surface layer portion of the silicon substrate 1. The gas phase thermal diffusion method may be, for example, a method in which a $POCl_3$ (phosphorus oxychloride) gas is used as the source of diffusion. It is sufficient that, for example, the second semiconductor layer 3 be formed to have a depth of approximately from 0.1 μm to 2 μm and a sheet resistance of approximately from 40Ω/□ to 200Ω/□.

In the gas phase thermal diffusion method, the silicon substrate 1 is heat treated in an atmosphere of a diffused gas including $POCl_3$ and the like at a temperature of approximately from 600° C. to 800° C. for approximately from 5 minutes to 30 minutes to form phosphorus glass on the first surface 1a of the silicon substrate 1, for example. The silicon substrate 1 is then heat treated in an atmosphere of an inert gas such as argon or nitrogen at a high temperature of approximately from 800° C. to 900° C. for approximately from 10 minutes to 40 minutes. Phosphorus is thereby diffused from the phosphorus glass into the surface layer portion of the silicon substrate 1 to form the second semiconductor layer 3 on the first surface 1a side of the silicon substrate 1, for example.

Next, if the second semiconductor layer 3 is also formed on the second surface 1b side of the silicon substrate 1 in the above-mentioned process of forming the second semiconductor layer 3, the second semiconductor layer 3 formed on the second surface 1b side of the silicon substrate 1 is removed by etching, for example. A p-type semiconductor region is thereby exposed on the second surface 1b side of the silicon substrate 1. The second semiconductor layer 3 formed on the second surface 1b side of the silicon substrate 1 is removed by immersing only the second surface 1b side of the silicon substrate 1 in a hydrofluoric-nitric acid solution, for example. Then, the phosphorus glass, which has adhered to the first surface 1a side of the silicon substrate 1 during the formation of the second semiconductor layer 3, is then removed by etching. Removal of and damage to the second semiconductor layer 3 on the first surface 1a side of the silicon substrate 1 are less liable to occur by removing the second semiconductor layer 3 formed on the second surface 1b side of the silicon substrate 1 by etching while allowing the phosphorus glass to remain on the first surface 1a side as described above. For example, the second semiconductor layer 3 formed on the third surfaces 1c of the silicon substrate 1 herein may also be removed.

In the process of forming the second semiconductor layer 3, a diffusion mask may be formed in advance on the second surface 1b side to form the second semiconductor layer 3 by gas phase thermal diffusion method and the like, and then the diffusion mask may be removed. A structure similar to the above-mentioned structure can be formed in this process. It is possible not to form the second semiconductor layer 3 on the second surface 1b side of the silicon substrate 1 herein. With this, the process of removing the second semiconductor layer 3 on the second surface 1b side is unnecessary.

The polycrystalline silicon substrate 1 including the first semiconductor layer 2 that includes the second semiconductor layer 3 as the n-type semiconductor region located on the first surface 1a side and that has the texture on its surface can be prepared in the above-mentioned manner.

Figure 8D:
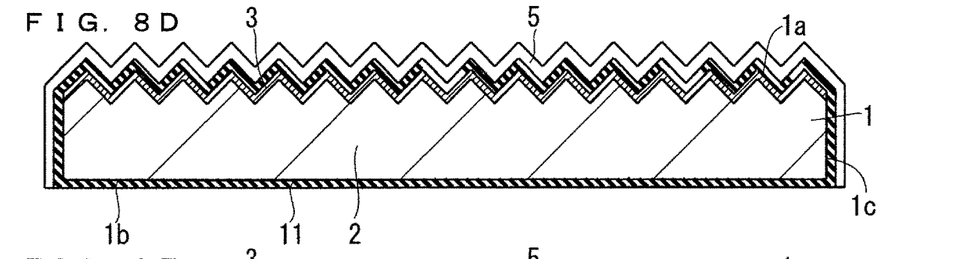

Next, the passivation layer 11 is formed on the first surface 1a of the first semiconductor layer 2 and the second surface 1b of the second semiconductor layer 3 as illustrated in FIG. 8D.

The passivation layer 11 can be formed by ALD method, for example. With this, the passivation layer 11 can be formed on the entire surface including the third surfaces 1c of the silicon substrate 1. In forming the passivation layer 11 by ALD method, the silicon substrate 1 in which the second semiconductor layer 3 has been formed is first placed in a chamber of a layer formation apparatus, for example. A series of processes including the following processes A to D are repeated a plurality of times while heating the silicon substrate 1 to a temperature range of from 100° C. to 250° C., for example. With this, the passivation layer 11 (or the first passivation layer 11a) having a desired thickness and containing aluminum oxide as a main component can be formed. One example of details of the processes A to D is as follows:

[Process A] A silicon material, such as bisdiethylaminosilane (BDEAS), for formation of a silicon oxide layer or an aluminum material, such as trimethylaluminum (TMA), for formation of an aluminum oxide layer is supplied to the silicon substrate 1 along with a carrier gas such as an argon (Ar) gas and a nitrogen gas. The silicon material or the aluminum material is thereby absorbed onto the entire surface of the silicon substrate 1. A period of time for supplying the BDEAS or the TMA to the silicon substrate 1 may be, for example, approximately from 15 milliseconds to 3,000 milliseconds.

The surface of the silicon substrate 1 may be terminated by the OH group at the start of the process A. In other words, the surface of the silicon substrate 1 may have a Si—O—H structure. This structure can be formed by cleaning the silicon substrate 1 with pure water after treatment with diluted hydrofluoric acid, for example.

[Process B] The inside of the chamber of the layer formation apparatus is purified with a nitrogen gas. In this case, the silicon material or the aluminum material in the chamber is removed. In this case, a silicon material or an aluminum material other than a component chemically absorbed into the silicon substrate 1 at an atomic layer level is further removed from the silicon material or the aluminum material physically and chemically absorbed onto the silicon substrate 1. A period of time for purifying the inside of the chamber with the nitrogen gas may be, for example, approximately from one second to dozens of seconds.

[Process C] An oxidizer such as water or an ozone gas is supplied into the chamber of the layer formation apparatus. In this case, the alkyl group contained in BDEAS or TMA is removed so that the OH group is substituted for the alkyl group. An atomic layer of a silicon oxide or an aluminum oxide is thereby formed on the silicon substrate 1. A period of time for supplying the oxidizer into the chamber may be, for example, approximately from 750 milliseconds to 1,100 milliseconds. Hydrogen atoms (H) are easily included in the silicon oxide or the aluminum oxide by supplying the hydrogen atoms along with the oxidizer into the chamber, for example.

[Process D] The inside of the chamber of the layer formation apparatus is purified with a nitrogen gas. With this, the oxidizer in the chamber is removed. For example, an oxidizer not having contributed to reaction during formation of the silicon oxide or the aluminum oxide at the atomic layer level on the silicon substrate 1 is herein removed. A period of time for purifying the chamber with the nitrogen gas may be, for example, approximately from one second to dozens of seconds.

For example, the second passivation layer 11b including silicon oxide herein may be formed by ALD method between the protective layer 12 and the first passivation layer 11a containing aluminum oxide. For example, the third passivation layer 11c may be formed between the first semiconductor layer 2 and the first passivation layer 11a including aluminum oxide. In any of these cases, for example, the second passivation layer 11b and/or the third passivation layer 11c each containing silicon oxide can be formed by repeating the series of processes including the above processes A to D a plurality of times while heating the silicon substrate 1 to a temperature range similar to the above-mentioned temperature range.

Next, as illustrated in FIG. 8D, the antireflection layer 5 is formed on the passivation layer 11 that is formed on the first surface 1a of the first semiconductor layer 2. For example, the antireflection layer 5 herein can be formed by using the PECVD method or sputtering method. When the PECVD method is used herein, for example, it is sufficient that the silicon substrate 1 be preheated to a temperature higher than a temperature during the formation of the passivation layer 11. After that, a mixed gas including silane ($SiH_4$) and ammonia ($NH_3$) is diluted by nitrogen ($N_2$), and is then decomposed by glow discharge at a reaction pressure within a range of from 50 Pa to 200 Pa. In this case, for example, the silane and ammonia are plasmatized to be deposited on the heated silicon substrate 1. With this, the antireflection layer 5 can be formed on the passivation layer 11 on the first surface 1a of the silicon substrate 1. In this case, for example, the temperature of forming the antireflection layer 5 can be approximately from 350° C. to 650° C., and the temperature of preheating the silicon substrate 1 can be approximately from 400° C. to 700° C., which is higher than the temperature for forming the layer by approximately 50° C. As the frequency of a high-frequency power source necessary for the glow discharge, for example, a frequency of from 10 kHz to 500 kHz can be used herein.

A flow rate of the mixed gas is herein appropriately determined in accordance with the size of the reaction chamber and the like, for example. The flow rate of the mixed gas herein may range from 150 ml/min (sccm) to 6,000 ml/min (sccm), for example. In this case, a ratio (=B/A) of the flow rate B of ammonia to the flow rate A of silane may be 0.5 to 15, for example.

Figure 8E:
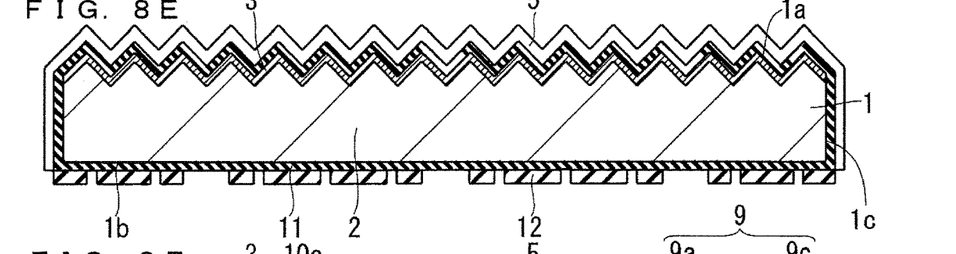

Next, as illustrated in FIG. 8E, the protective layer 12 is formed on at least a part of the passivation layer 11. For example, using screen printing or the like, an insulation paste containing silicon oxide is herein applied on at least a part of the passivation layer 11 so as to form a desired pattern. After the application of the insulation paste, the insulation paste is dried under the drying conditions of the maximum temperature of approximately from 150° C. to 350° C. and a heating time of approximately from 1 minute to 10 minutes, using a hot plate, a drying oven, or the like. With this, the protective layer 12 having the desired pattern can be formed on the passivation layer 11 (or the first passivation layer 11a). For example, with the protective layer 12 formed under such drying conditions in the above, the passivation layer 11 is herein hardly fired through by a metal paste for forming the first electrode 6 during the formation of the first electrode 6 to be described later. As a result, for example, the passivation effect is hardly reduced. For example, adhesion between the protective layer 12 and the passivation layer 11 (or the first passivation layer 11a) and the first electrode 6 is hardly reduced.

For example, the protective layer 12 herein may be forming at a position other than the position where the second electrodes 7 come in contact with the second surface 1b of the silicon substrate 1. In this case, for example, the insulation paste may be printed in a desired pattern on the passivation layer 11, such that the non-formation region of the protective layer 12 is formed in the region where the plurality of second electrodes 7 are formed. In this case, for example, the process of removing a part of the protective layer 12 with laser beam radiation or the like is unnecessary. As a result, for example, productivity of the solar cell element 10 can be enhanced.

The voids 13 are herein easily formed at positions where the insulation paste is applied so as to have a film thickness larger than that in a peripheral portion. For example, the insulation paste is printed a plurality of times at portions, where the voids 13 are desired to be formed, on the passivation layer 11. With this, the thickness of the insulation paste can be locally increased. In this case, for example, the protective layer 12 forming after drying of the insulation paste has distribution in thickness. During cooling in a process of firing a metal paste (also referred to as a firing process) with the maximum temperature of from 600° C. to 850° C. to be described later, a portion of the protective layer 12 having a larger thickness is more liable to contract than a portion thereof having a smaller thickness. With this, for example, cracks are easily generated in the protective layer 12 at portions having a large thickness. The cracks thus generated in this case can serve as the voids 13. For example, it is sufficient that the protective layer 12 be herein formed such that the thickness of the region to form the voids 13 is from 1.3 to 1.5 times or more as large as the thickness of the region not to form the voids 13. Note that, the thickness of the protective layer 12 may be, for example, appropriately changed in accordance with a material of the insulation paste. For example, even if a temperature in the firing process of a metal paste to be described later is approximately 500° C., obvious distribution in thickness of the protective layer 12 herein allows the voids 13 to be easily formed at portions of the protective layer 12 having a relatively large thickness.

Incidentally, the amount of the insulation paste applied on the passivation layer 11 may be appropriately changed in accordance with, for example, the size of the roughness on the second surface 1b of the silicon substrate 1, the type or the content of a glass frit included in a metal paste containing aluminum as its component to be described later, and the firing conditions during formation of the second electrodes 7.

Figure 8F:
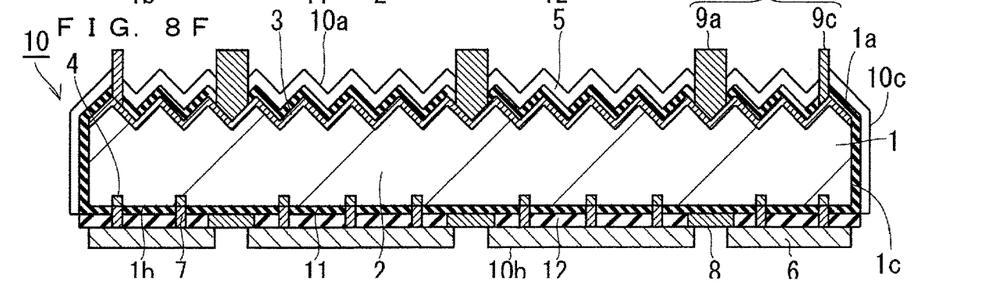

Next, as illustrated in FIG. 8F, the first electrode 6, the second electrodes 7, the third electrodes 8, and the fourth electrodes 9 are formed as described below.

The first electrode 6 is formed, for example, using a metal paste (also referred to as a first metal paste) containing a metal powder including aluminum as a main component, an organic vehicle, a glass frit, etc. For example, the first metal paste is herein applied to the second surface 1b side of the silicon substrate 1 to be in contact with a portion of an applied second metal paste to be described later. Here, for example, the first metal paste may be applied to almost the entire surface of the silicon substrate 1 on the second surface 1b side except for a part of the portion at which the third electrode 8 is formed. The first metal paste can be applied by screen printing or the like, for example. The first metal paste may be dried after application of the first metal paste by vaporizing a solvent at a predetermined temperature, for example. The first metal paste is then fired in a firing oven under conditions of the maximum temperature of approximately from 600° C. to 850° C. and a heating time of approximately from dozens of seconds to dozens of minutes, for example, and the first electrode 6 can thereby be formed on the second surface 1b side of the silicon substrate 1. Note that, in this case, for example, the first metal paste located on the protective layer 12 is blocked by the protective layer 12, and is therefore hardly fired through the passivation layer 11. That is, for example, owing to the presence of the protective layer 12, the passivation layer 11 is less affected by the fire through during the firing of the first metal paste. In other words, for example, reduction in the electric field passivation effect due to reduction of the passivation layer 11 is hardly caused.

The second electrodes 7 are formed through a process in which, for example, the first metal paste fires through the passivation layer 11 during the firing of the first metal paste, such that the second electrodes 7 are brought into connection with the first semiconductor layer 2 in a manner of penetrating through the non-formation region of the protective layer 12. In this case, for example, aluminum contained in the first metal paste that has fired through the passivation layer 11 diffuses in a surface layer portion of the second surface 1b side of the silicon substrate 1, thereby also forming the third semiconductor layer 4.

The third electrode 8 is formed, for example, using a metal paste (also referred to as a second metal paste) containing a metal powder including silver as a main component, an organic vehicle, a glass frit, etc. The second metal paste can be applied on the second surface 1b of the silicon substrate 1 by screen printing or the like, for example. The second metal paste may be dried after application of the second metal paste by vaporizing a solvent at a predetermined temperature, for example. The second metal paste is then fired in a firing oven under conditions of the maximum temperature of approximately from 600° C. to 850° C. and a heating time of approximately from dozens of seconds to dozens of minutes, for example, and the third electrode 8 can thereby be formed on the second surface 1b side of the silicon substrate 1.

The fourth electrodes 9 are formed, for example, using a metal paste (also referred to as a third metal paste) containing a metal powder including silver as a main component, an organic vehicle, a glass frit, etc. First, the third metal paste is herein applied on the first surface 1a side of the silicon substrate 1. The third metal paste is then fired in a firing oven under conditions of the maximum temperature of approximately from 600° C. to 850° C. and a heating time of approximately from dozens of seconds to dozens of minutes, and the fourth electrodes 9 can thereby be formed. The third metal paste herein can be applied by screen printing or the like, for example. The third metal paste may be dried after application of the third metal paste by vaporizing a solvent at a predetermined temperature. For example, using screen printing, the output extracting electrode 9a and the collecting electrodes 9b of the fourth electrodes 9 herein can be formed in one process.

The voids 13 can be generated by the contraction of the protective layer 12 during cooling in the firing process of the first metal paste, the second metal paste, and the third metal paste, for example. For example, in the firing process, condensation polymerization of siloxane resin in the insulation paste herein proceeds, and a phenomenon in which alkyl groups turn into alcohol to be vaporized proceeds as well. For this reason, for example, the contracting amount of the protective layer 12 is increased during the cooling in the firing process at positions in the insulation paste where the insulation paste is applied so as to have a film thickness larger than that in a peripheral portion, and the voids 13 are thus easily formed. The voids 13 as cracks are thereby easily generated in the protective layer 12. The voids 13 thus formed hardly include a component of the first electrode 6. As a result, for example, the metal paste hardly fires through portions of the passivation layer 11 facing the voids 13 during the formation of the first electrode 6. Accordingly, reduction in the passivation effect due to reduction of the passivation layer 11 is hardly caused.

For example, when the protective layer 12 has distribution in thickness so as to easily generate the voids 13, the contact area at an interface between the protective layer 12 and the first electrode 6 is increased. In this case, for example, adhesion between the protective layer 12 and the first electrode 6 is enhanced.

Through the processes above, the solar cell element 10 can be manufactured.

Incidentally, in the manufacturing of the solar cell element 10 according to one embodiment described above, for example, the first electrode 6 may be formed after forming the third electrode 8. For example, the passivation layer 11 may be present or the passivation layer 11 may be absent between the third electrode 8 and the silicon substrate 1. That is, for example, the third electrode 8 may be formed so as to come in direct contact with the second surface 1b of the silicon substrate 1, or may be formed on the protective layer 12.

In the manufacturing of the solar cell element 10 according to one embodiment described above, for example, the first electrode 6, the second electrodes 7, the third electrodes 8, and the fourth electrodes 9 may be formed by applying a metal paste for forming each of the electrodes and then firing all of the metal pastes at the same time. For example, the productivity of the solar cell element 10 is thereby enhanced, and the output characteristics of the solar cell device 10 are hardly reduced owing to reduction in heat history of the silicon substrate 1. That is, the output characteristics of the solar cell element 10 can be enhanced.

In the manufacturing of the solar cell element 10 according to one embodiment described above, for example, the passivation layer 11 may be formed after forming the antireflection layer 5. For example, the antireflection layer 5 containing silicon nitride having a positive fixed charge is thereby directly formed on the second semiconductor layer 3. For example, the electric field passivation effect on the front surface 10a side of the solar cell element 10 can thereby be enhanced. As a result, the output characteristics of the solar cell element 10 can be enhanced. For example, after formation of the passivation layer 11, the passivation layer 11 formed on the first surface 1a of the silicon substrate 1 may be removed using a mixed solution of hydrofluoric acid and nitric acid, and the antireflection layer 5 then may be formed on the first surface 1a of the silicon substrate 1.

The invention claimed is:

1. A solar cell element comprising:
a semiconductor substrate;
a passivation layer located on the semiconductor substrate;
a protective layer located on the passivation layer and being in direct contact with the passivation layer;
a first electrode located on the protective layer; and
a plurality of second electrodes located so as to penetrate the passivation layer and the protective layer and electrically connected to the first electrode, wherein
the protective layer comprises at least one void located from a first lower surface of the first electrode close to the semiconductor substrate up to a first upper surface of the passivation layer close to the first lower surface, wherein the at least one void comprises an empty space, and wherein each of the plurality of second electrodes is connected to the semiconductor substrate and none of the plurality of second electrodes is exposed to the empty space.

2. The solar cell element according to claim 1, wherein the at least one void comprises a linear opening on a second upper surface of the protective layer close to the first electrode.

3. The solar cell element according to claim 1, wherein the protective layer comprises a plurality of voids, and
a distance between centers of two adjacent voids among the plurality of voids is smaller than a smallest distance between centers of two adjacent second electrodes among the plurality of second electrodes.

4. The solar cell element according to claim 1, wherein an opening width of at least one void on a second upper surface of the protective layer on the first electrode side is smaller than a smallest length of each of the plurality of second electrode.

5. The solar cell element according to claim 1, wherein an opening width of at least one void becomes smaller as approaching toward the first upper surface from the first lower surface.

6. The solar cell element according to claim 1, wherein the passivation layer contains aluminum oxide, and the protective layer contains silicon oxide.

7. The solar cell element according to claim 6, further comprising a silicon oxide layer located between the semiconductor substrate and the passivation layer.

8. The solar cell element according to claim 1, wherein the protective layer comprises an alkyl group.

9. A solar cell element comprising:
a semiconductor substrate;
a passivation layer located on the semiconductor substrate;
a protective layer located on the passivation layer and being in direct contact with the passivation layer; and
a first electrode located on the protective layer,
wherein the protective layer comprises at least one void located from a first lower surface of the first electrode close to the semiconductor substrate up to a first upper surface of the passivation layer close to the first lower surface, wherein the at least one void comprises an empty space, and
wherein each of the at least one void consists of an empty space, the empty space being surrounded by the first lower surface, the first upper surface and a surface of the protective layer.

* * * * *